United States Patent
Schmitz et al.

(10) Patent No.: US 6,504,235 B2
(45) Date of Patent: Jan. 7, 2003

(54) PASSIVATION LAYER AND PROCESS FOR SEMICONDUCTOR DEVICES

(75) Inventors: Adele E. Schmitz, Newbury Park, CA (US); Julia J. Brown, Santa Monica, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 7 days.

(21) Appl. No.: 09/876,538

(22) Filed: Jun. 6, 2001

(65) Prior Publication Data

US 2001/0028100 A1 Oct. 11, 2001

Related U.S. Application Data

(60) Continuation of application No. 09/143,680, filed on Aug. 28, 1998, now Pat. No. 6,316,820, which is a division of application No. 08/897,995, filed on Jul. 25, 1997, now abandoned.

(51) Int. Cl.$^7$ ............................................. H01L 23/58
(52) U.S. Cl. ...................................... 257/649; 257/615
(58) Field of Search ................................ 257/649, 615

(56) References Cited

U.S. PATENT DOCUMENTS

| | | | |
|---|---|---|---|
| 4,426,656 A | 1/1984 | DeLorenzo et al. | ............ 357/22 |
| 4,458,295 A | 7/1984 | Durschlag et al. | ............ 361/322 |
| 4,543,271 A | 9/1985 | Peters | ........................ 427/54.1 |
| 4,663,258 A | 5/1987 | Pai et al. | ........................ 430/57 |
| 4,843,034 A | 6/1989 | Herndon et al. | ............ 437/189 |
| H665 H | 8/1989 | Knolle et al. | ................... 357/52 |
| 4,870,470 A | 9/1989 | Bass, Jr. et al. | ............. 357/23.5 |
| 4,910,164 A | 3/1990 | Shichijo | ....................... 437/90 |
| 5,010,024 A | 4/1991 | Allen et al. | .................... 437/24 |
| 5,144,391 A | 9/1992 | Iwata et al. | ................. 357/23.7 |
| 5,164,329 A | 11/1992 | Moyer et al. | ................ 437/126 |
| 5,223,458 A | 6/1993 | Shanfield et al. | ............ 437/225 |
| 5,264,724 A | 11/1993 | Brown et al. | ................. 257/347 |
| 5,374,843 A | 12/1994 | Williams et al. | ............. 257/492 |
| 5,390,141 A | 2/1995 | Cohen et al. | .................. 365/96 |
| 5,459,096 A | 10/1995 | Venkatesan et al. | .......... 437/67 |
| 5,552,335 A | 9/1996 | Mahon et al. | ................. 437/53 |
| 5,668,049 A | 9/1997 | Chakrabarti et al. | .......... 438/33 |
| 5,757,039 A | 5/1998 | Delaney et al. | .............. 257/198 |
| 5,766,981 A | 6/1998 | Thornton et al. | ............. 438/36 |
| 6,316,820 B1 * | 11/2001 | Schmitz et al. | .............. 257/649 |

OTHER PUBLICATIONS

Wolf, Stanley, Silicon Processing for the VLSI Era vol. 2–Process Integration, (1990) pp. 273–276, Dec., 1990.

* cited by examiner

Primary Examiner—Mark V. Prenty
(74) Attorney, Agent, or Firm—V. D. Duraiswamy; M. W. Sales

(57) ABSTRACT

A semiconductor passivation technique uses a plasma enhanced chemical vapor deposition (PECVD) process to produce a silicon-rich nitride film as a passivation layer on a Group III-V semiconductor device. The silicon-rich film has a nitrogen to silicon ratio of about 0.7, has a relatively high index of refraction of, for example, approximately 2.4, is compressively stressed, and is very low in hydrogen and oxygen content.

10 Claims, 3 Drawing Sheets

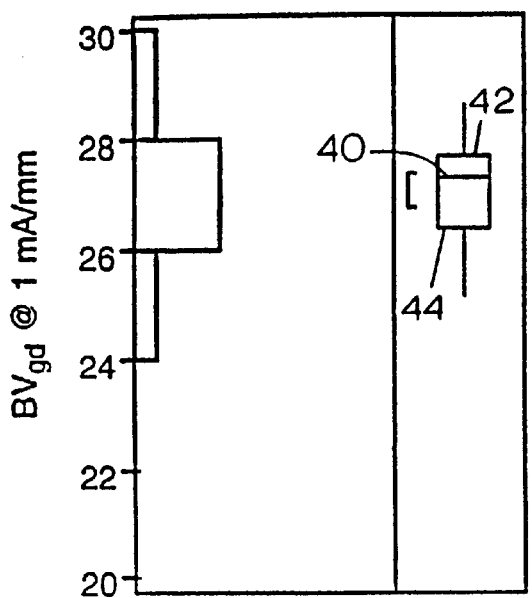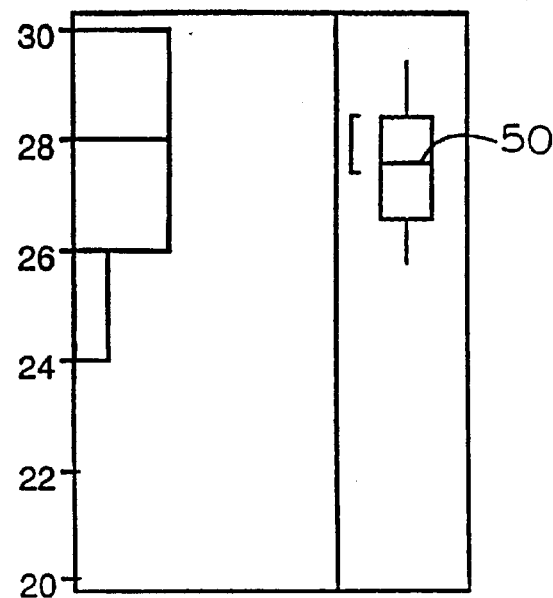
FIG. 2A          FIG. 2B
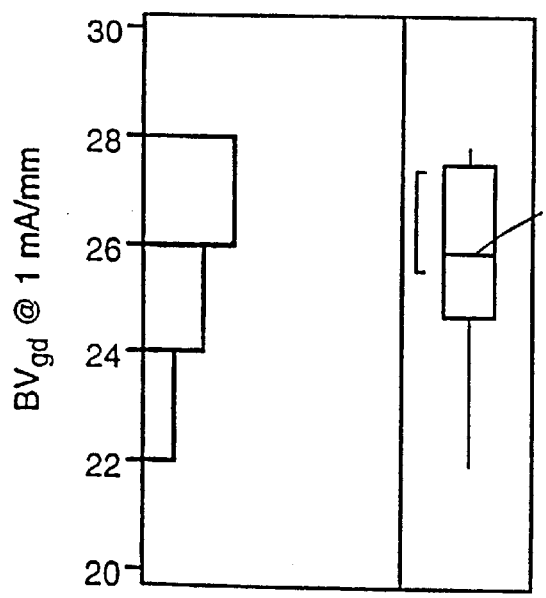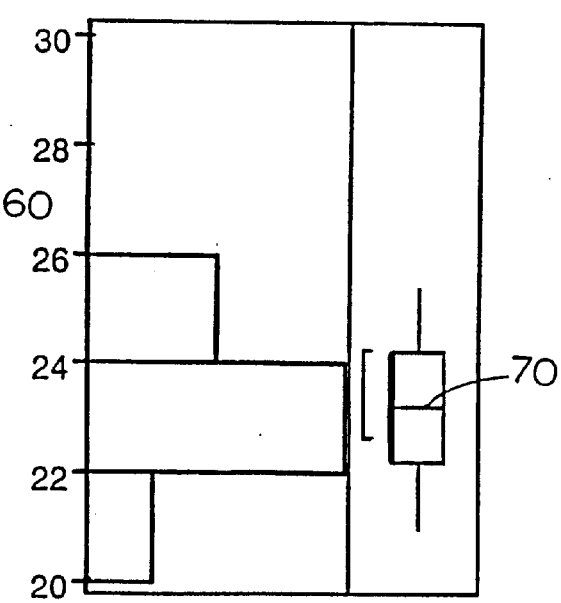
FIG. 3A          FIG. 3B

PASSIVATION LAYER AND PROCESS FOR SEMICONDUCTOR DEVICES

This application is a continuation of Ser. No. 09/143,680, filed Aug. 28, 1998 (now U.S. Pat. No. 6,316,820) which was a divisional of 08/897,995, filed Jul. 25, 1997 (now abandoned). The entire subject matter of both these applications are incorporated herein by this reference.

BACKGROUND OF THE INVENTION (a) Field of the Invention

The present invention relates generally to semiconductor manufacturing processes and, more particularly, to techniques for passivating semiconductor devices.

(b) Description of Related Art

Semiconductor devices, such as gallium arsenide field effect transistors (GaAs FETs) are commonly used in, for example, military and commercial microwave communications circuitry. The pseudomorphic high electron mobility transistor (PHEMT) is one type of GaAs FET that is regularly used in, for example, solid state power amplifiers within satellite and other space-based communication systems, such as L-band and C-band commercial satellite systems and X-band, $K_a$-band, and V-band military satellite systems. Because semiconductor devices, such as pHEMTs, are located within satellites and other sophisticated communications equipment, it is necessary that these devices last a considerable amount of time and are immune to the deteriorating effects of elements within the environment in which they are used. Without such immunity, oxygen, hydrogen, water, etc., will operate to modify the electrical characteristics of these devices over time. For example, semiconductor devices exposed to hydrogen (which is emitted even by components located within satellite packages in space) generally demonstrate a shift or a gradual drift in the pinch-off voltage and in the optimum gate voltage thereof, which reduces the maximum transconductance and the maximum output power of these devices.

It is common practice to encapsulate semiconductor devices, such as a pHEMTs, in an inert material to isolate the device from its immediate environment and, thereby, to protect the device from oxygen, water, etc. within the environment. In general, all Group III-V FETs employ some form of encapsulation process to protect these devices from airborne or space-borne contaminants, particulates, and humidity. This encapsulation process also passivates these semiconductor devices by terminating dangling bonds created during manufacture of the semiconductor devices and by adjusting the surface potential to either reduce or increase the surface leakage current associated with these devices.

Silicon nitride is commonly used to produce a passivation layer on semiconductor devices, such as GaAs metal semiconductor FETs (MESFETs), to prevent oxidation of the surfaces of these devices. In fact, silicon nitride is one of the most widely used materials for passivation layers on GaAs semiconductor devices due to the fact that this material is extremely chemically stable and has excellent barrier properties.

The most common technique used to deposit silicon nitride on GaAs semiconductor devices, such as discrete MESFET devices or MESFET devices incorporated as part of monolithic microwave integrated circuits, is the plasma enhanced chemical vapor deposition (PECVD) technique. In this context, the PECVD technique provides a plasma of reactant gases including silicon and nitrogen to a chamber in which a semiconductor is disposed. The gases are then reacted within the chamber to deposit a layer or film of silicon nitride on the surface of the semiconductor. While the gases may be reacted within the chamber at a temperature in the range of approximately 150° C. to 350° C., most PECVD techniques react the gases at temperature ranges between 200° C. and 350° C. to deposit silicon nitride on Group III-V semiconductors.

U.S. Pat. No. 5,223,458 discloses that silicon nitride, silicon monoxide, silicon dioxide, silicon oxynitride, or polymide can be used to produce a passivation layer on the surface of a GaAs semiconductor -device to isolate exposed surfaces of the GaAs device from an external environment. Likewise, U.S. Pat. No. 4,426,656 discloses a PECVD process that deposits a silicon nitride passivation layer on GaAs MESFETs to prevent oxidation of the exposed semiconductor surfaces of the devices. This process uses an ammonia to silane gas ratio in the range of 1.62 to 2.05 to produce a silicon nitride film or passivation layer that is under tensile stress and has a nominal index of refraction of 2.0.

However, it is generally recognized that silicon nitride passivation layers have undesirable characteristics and, in particular, that silicon nitride passivation layers tend to change the threshold and/or reverse breakdown voltages of the semiconductor devices on which they are used. In fact, a particular problem with the use of silicon nitride as a passivation layer in most semiconductor devices arises because silicon nitride layers tend to produce an undesirable reduction in the reverse breakdown voltage between, for example, the gate and drain electrodes of FET devices as well as between the drain and source electrodes of FET devices. This reduction in the reverse breakdown voltage reduces the effectiveness of such devices when used in, for example, power amplifiers.

Although silicon nitride passivation techniques have been improved in an attempt to minimize the reduction in the reverse breakdown voltage of the semiconductor devices on which they are used, these improved processes still cause some appreciable reduction in the reverse breakdown voltage. For example, U.S. Pat. No. 5,223,458, discloses a technique for passivating Group III-V MESFETs that reduces the degradation of the gate-to-drain breakdown voltage of these devices over other known passivation processes. The passivation process disclosed in this patent uses a plasma surface treatment to introduce an electronegative species, such as $0_2$, into the surface of the MESFET before applying a silicon nitride passivation layer onto the MESFET. However, in the disclosed example, this passivation process still reduced the average reverse breakdown voltage of the device from approximately 19.5 volts to approximately 18.0 volts.

Although it is known to use silicon nitride passivation layers in semiconductor devices, it is believed that prior art passivation processes only use passivation layers having a low silicon content similar to that of stoichiometric silicon nitride $Si_3N_4$, i.e., silicon-poor layers. It is also believed that all prior art silicon nitride passivation layers are under tensile stress. These facts may, in part, result from the generally accepted belief that using a high silicon content in a passivation layer, i.e., using a silicon-rich passivation layer, decreases the ability to dry-etch the device in subsequent processing.

SUMMARY OF THE INVENTION

The present invention relates to a silicon-rich, compressively stressed semiconductor passivation layer and to a passivation process that deposits a silicon-rich, compressively stressed passivation layer or thin film on a semiconductor device, such as a GaAs based power HEMT. This silicon-rich passivation layer produces a desirable encapsulant that provides for long life of the semiconductor device without significantly negatively effecting certain characteristics of the semiconductor device, such as the reverse breakdown voltage. In fact, this silicon-rich, compressively stressed passivation layer may increase the reverse breakdown voltage of the semiconductor device on which it is used which, in turn, enhances the effectiveness of the device in certain communication applications, such as in amplifiers. Furthermore, this silicon-rich, compressively stressed passivation layer does not reduce the ability to dry-etch the semiconductor device in subsequent processing.

The passivation technique of the present invention may use a PECVD process to produce a silicon-rich nitride film as a passivation layer on a semiconductor device. The silicon-rich film of the present invention has a relatively high index of refraction when compared to stoichiometric silicon nitride ($Si_3N_4$), for example, approximately 2.4, is compressively stressed, and has a very low hydrogen and oxygen content. Although this passivation layer may be applied to any semiconductor device, it is particularly useful when applied to Group III-V semiconductor devices such as GaAs semiconductor devices and Gallium Nitride (GaN) semiconductor devices.

According to one aspect of the present invention, a semiconductor device, such as a Group III-V semiconductor device, includes a compressively stressed nitride passivation layer disposed on a surface of a semiconductor material. The passivation layer may be compressively stressed to about $8 \times 10^9$ dynes/$cm^2$ and, preferably, is compressively stressed to less than $1 \times 10^{10}$ dynes/$cm^2$. Furthermore, the passivation layer may be low in hydrogen and oxygen content with respect to stoichiometric silicon nitride ($Si_3N_4$) and, preferably, has a hydrogen content below about twenty atomic percent and an oxygen content below about five atomic percent.

According to another aspect of the present invention, a semiconductor device, such as a Group III-V semiconductor device, includes a silicon nitride passivation layer disposed on a surface of a semiconductor material, wherein the silicon nitride layer is silicon-rich with respect to stoichiometric silicon nitride ($Si_3N_4$). The silicon-rich passivation layer may have a nitrogen/silicon ratio between about 0.5 and 0.9 and, preferably, has a nitrogen/silicon ratio of about 0.7.

According to still another aspect of the present invention, a semiconductor device, such as a Group III-V semiconductor device, includes a silicon nitride passivation layer having an index of refraction greater than or equal to about 2.2 disposed on a surface of a semiconductor material.

In accordance with yet another aspect of the present invention, a method of passivating a Group III-V semiconductor device includes the steps of placing the semiconductor device in a chemical deposition chamber, introducing silicon and nitrogen based gasses based into the chamber and reacting the gasses within the chamber to deposit a silicon nitride passivation layer on a surface of the semiconductor device that is silicon-rich with respect to stoichiometric silicon nitride ($Si_3N_4$). In addition or in the alternative, the gasses may be reacted to produce a passivation layer having an index of refraction greater than or equal to 2.2 and/or a passivation layer that is compressively stressed. Silane and ammonia may be introduced into the chamber as the silicon and nitrogen based gasses, respectively, at an ammonia to silane ratio of about 0.2.

BRIEF DESCRIPTION OF THE DRAWINGS

FIGS. 2A and 2B are charts illustrating the wafer distribution of the reverse gate-to-drain breakdown voltage of a set of semiconductor devices before and after application of the passivation technique of the present invention;

FIGS. 3A and 3B are charts illustrating the wafer distribution of the reverse gate-to-drain breakdown voltage of a set of semiconductor devices before and after application of a prior art passivation technique.

DESCRIPTION OF THE PREFERRED EMBODIMENTS

Figure 1:
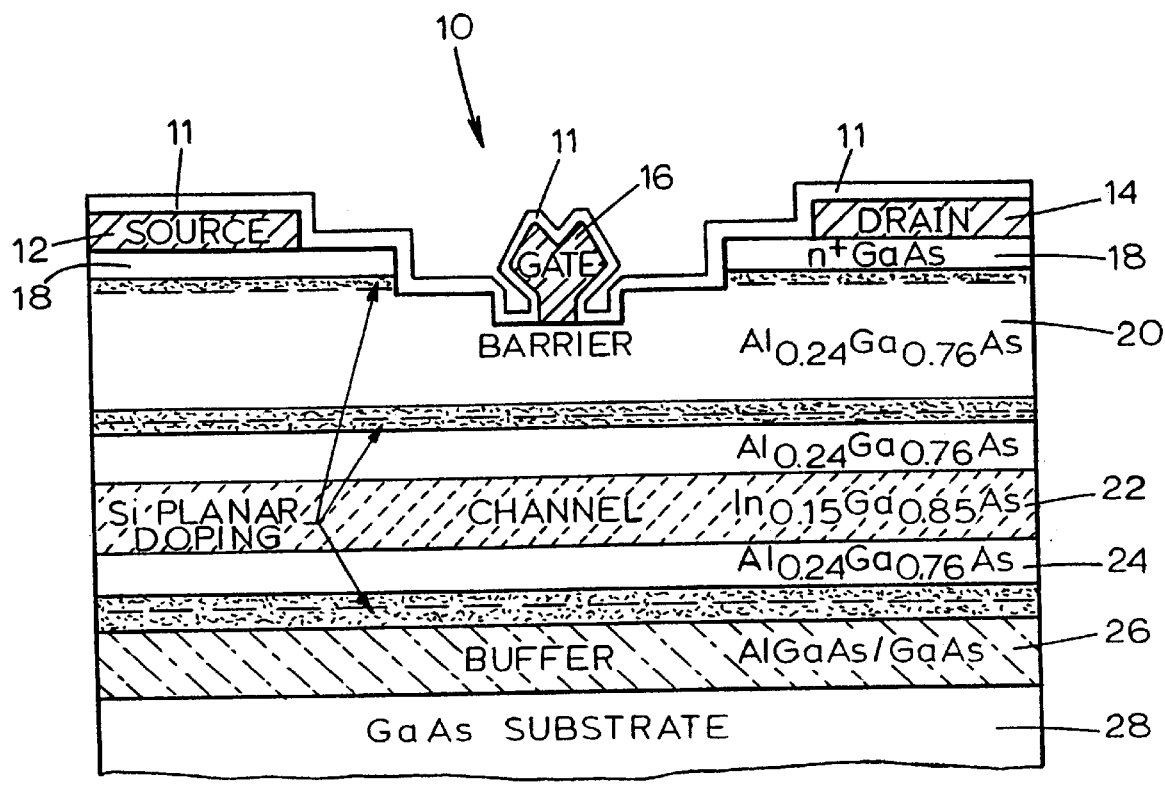
FIG. 1 is a cross-sectional view of a pHEMT having a passivation layer according to the present invention disposed thereon.

While the passivation process or passivation layer described herein may be applied to and used with any semiconductor device, it is best suited for use with Group III-V semiconductor devices and, especially, GaAs and GaN based semiconductor devices.

Generally, the passivation process according to the present invention produces a silicon nitride passivation layer or thin film that is silicon-rich with respect to stoichiometric silicon nitride ($Si_3N_4$). More specifically, this silicon nitride passivation layer or film has a silicon content that is greater than the silicon content of stoichiometric $Si_3N_4$, which has a nitrogen/silicon ratio of approximately 1.33. Preferably, when used with a Group III-V semiconductor device and, particularly, a GaAs semiconductor device, the passivation layer according to the present invention has a nitrogen/silicon ratio between about 0.5 and 0.9 and, most preferably, has a nitrogen/silicon ratio around about 0.7. It is considered that a nitrogen/silicon ratio below about 0.5 is disadvantageous because the high silicon content of the layer may cause undesirable effects in the semiconductor device on which it is used, such as metal buckling, etc. However, the nitrogen/silicon ratio range of 0.5 to 0.9 may shift or change somewhat for other Group III-V semiconductor devices, such as GaN devices.

Still further, a silicon nitride passivation layer or film according to the present invention has an index of refraction that is higher than that of stoichiometric silicon nitride ($Si_3N_4$) which, as is known, is approximately 2.05. Preferably, the index of refraction of the silicon nitride passivation layer of the present invention is in the range of about 2.2 to about 2.5 and, most preferably, is around approximately 2.4. Of course, increasing the silicon/nitrogen ratio of the passivation layer operates to increase the index of refraction of that layer. While silicon nitride passivation layers having indices of refraction greater than about 2.5 may operate to perform some of the advantages of the present invention, these layers are generally considered to have too high of a silicon content which, as noted above, may cause undesirable effects within the devices on which they are used.

Moreover, a silicon nitride passivation layer or thin film according to the present invention is under compressive stress as opposed to tensile stress. As is known in the art, a film or layer under compressive stress exhibits a convex surface after being deposited on a semiconductor device while a film or layer under tensile stress exhibits a concave surface after being deposited on a semiconductor device. The silicon nitride passivation layer according to the present invention preferably has a stress measurement anywhere in the range between zero compressive and a point at which adverse effects, such as metal buckling, may occur. It is considered desirable to keep the stress value of the nitride passivation layer less than about $1\times10^{10}$ dynes/cm$^2$ compressive and most desirable to manufacture the silicon nitride passivation layer at a compressive stress value of about $8\times10^9$ dynes/cm$^2$.

A silicon nitride passivation layer or film according to the present invention may also be very low in hydrogen and oxygen content. Preferably, the hydrogen content of the film is about 20 atomic percent or less (as compared to about 25 atomic percent for stoichiometric $Si_3N_4$) and the oxygen content of the film is less than approximately five atomic percent. It is believed that lowering the hydrogen and/or oxygen content of the film or passivation layer increases the quality of that film or layer when used as a semiconductor passivation layer because the reduction in the hydrogen and/or oxygen content produces a denser film.

It is believed that the higher silicon content of a passivation layer having one or more of the above-identified properties decreases the sensitivity of a semiconductor device to humidity, hydrogen, etc. as compared to other passivation layers having a lower silicon content, without significant negative effects in the properties of the device. Thus, for example, a silicon nitride layer passivation layer having one or more of the above-described properties provides an excellent barrier layer, i.e., encapsulant, when used on a semiconductor device, such as Group III-V semiconductor device, without producing a significant degradation in the reverse gate-to-drain breakdown voltage of the device. In fact, it has been found that, at least in some cases, such a passivation layer operates to increase the reverse gate-to-drain breakdown voltage of the device which makes the semiconductor device more desirable (i.e., efficient, etc.) when used in, for example, amplifiers. Likewise, it has been found that passivation layers having the above-identified properties reduce the gate leakage currents of the semiconductor devices on which they are used. An advantage of a higher reverse breakdown voltage is increased output power due to the increased voltage swing of the device while an advantage of decreased gate leakage current is increased device reliability.

It has also been found that, contrary to generally accepted beliefs, a standard reactive ion etch may be employed for passivation films having one or more of the above-identified properties. In fact, the standard etch used for tensile silicon nitride films having indices of refraction of about 2.0 may be used on, for example, pHEMT semiconductor devices, having passivation layers with one or more of the above-identified properties.

FIG. 1 illustrates a standard C-band GaAs pHEMT device 10 having a silicon-rich passivation layer 11 according to the present invention disposed thereon. As is known, the pHEMT 10 includes a source electrode 12, a drain electrode 14 and a gate electrode 16. A layer of n doped GaAs material 18 is disposed directly beneath the source and drain electrodes 12 and 14 while a layer of semiconductor material 20 comprising $Al_{0.24}Ga_{0.76}As$ (a barrier layer) is disposed below the material 18 and the gate electrode 16. The layer 20 has Si planar doping layers on an upper portion and a middle portion thereof, as illustrated in FIG. 1. A channel layer 22 made of $IN_{0.15}Ga_{0.85}As$ is disposed below the layer 20. A second layer 24 of $Al_{0.24}Ga_{0.76}As$ having Si planar doping on a lower portion thereon is disposed between the channel layer 22 and a buffer layer 26 made of AlGaAs/GaAs. The buffer layer 26 is disposed on a GaAs substrate 28.

The pHEMT device 10 of FIG. 1, without the silicon-rich passivation layer 11, is commonly known in the art and may be manufactured according to any known or desired technique. After the PHEMT 10 has been manufactured, the pHEMT 10 or the wafer on which it is formed may be subjected to a silicon nitride passivation or deposition process as described below to place the silicon-rich passivation layer 11 on a surface thereof, such as on a top surface of the layer 20 (FIG. 1).

Preferably, the silicon nitride passivation or deposition process of the present invention is performed within two to four hours of the e-beam lithography defined metal gate evaporation step of the semiconductor manufacturing process to insure minimal exposure of the upper semiconductor layer, e.g., the AlGaAs layer 20 of the PHEMT of FIG. 1, to the atmosphere. In any event, the device or wafer being subjected to the passivation process is first cleaned using any desired or known semiconductor solvent cleaning process. For example, a semiconductor device, such as the PHEMT of FIG. 1 (without the passivation layer 11), may be cleaned in acetone for approximately 20 minutes, rinsed in an isopropyl alcohol bath for about 2 minutes and then blown dry with nitrogen to remove any residual contamination resulting from prior processing steps.

The cleaned semiconductor or wafer is then loaded into a PECVD deposition chamber (not shown) and placed onto a platen heated to about 300° C. The PECVD chamber is then evacuated and a PECVD process is used to deposit the compressively stressed, silicon-rich nitride passivation layer 11 on a surface of the semiconductor or wafer. Any standard, known, or desired PECVD process may be used as long as the gas flows, pressure, and power ranges of the process are configured to produce a compressively stressed, silicon-rich nitride passivation layer on the semiconductor device or wafer. The gas flows, pressure, and power necessary to produce such a layer will be understood or easily determined by those skilled in the art. Generally, however, to create a compressively stressed, silicon rich passivation layer according to the preset invention, silicon and nitrogen based gasses, such as silane and ammonia gasses, respectively, are introduced into the PECVD chamber and are reacted therein to deposit a silicon-rich film on a surface of the semiconductor. This surface may comprise, for example, the surface of the semiconductor material between the source and gate electrodes and between the gate and drain electrodes of the device.

In one example, in which a passivation layer according to the present invention was deposited on a pHEMT device, conditions during the PECVD process included gas flows of about 64.6 sccms (standard cubic centimeters per minute) of 5% ammonia in nitrogen, 11.6 sccms of silane and 194 sccms of nitrogen. The pressure of the chamber was kept at about 700 mTorr, and the power provided during the process was about 23 watts.

Primarily, the amount of silicon introduced into the chamber and deposited within the passivation layer controls whether the developed film is under compressive or tensile stress. Decreasing the amount of ammonia gas (which decreases the available nitrogen and, therefore, increases the silicon content of the passivation layer) produces a more compressively stressed silicon nitride layer while increasing the ammonia gas produces a layer that tends to be under tensile stress. It is considered that ammonia to silane ratios on the order of 0.1 to 0.25 are adequate to produce a compressively stressed nitride layer on GaAs devices. The example identified above used an ammonia to silane ratio of about 0.2.

Secondarily, the amount of power supplied during the PECVD process controls whether or not the film will be compressively stressed. Generally, high and low input powers produce tensile films. However, there is a range of power at which a compressive film will result for a given amount of silicon. It is believed that an input power range of 20 to 24 watts produces a compressive film when introducing ammonia and silane at an ammonia to silane ratio of about 0.2 in a PECVD process.

In the described example, the deposition time was roughly five minutes, which produced a film of 1000 Å thickness. However, as is known, longer or shorter deposition times may be used to produce thinner or thicker films or passivation layers. Generally, the thickness of the passivation layer will be between 500 Å and 2000 Å, based on the frequency of electromagnetic energy with which the semiconductor device is to be used. However, other film thicknesses and, therefore, deposition times may also be used.

Under the conditions of the above-described example, the PECVD process produced a compressively stressed silicon nitride film at $8 \times 10^9$ dynes/cm$^2$ having a refractive index of about 2.4. For this example, the thickness and refractive index of the passivation layer were measured on a separate Si test wafer with an ellipsometer. Samples measured by the Rutherford Backscaterring (RBS) technique indicated that the compressive film had a nitrogen/silicon ratio of 0.7, that the hydrogen content of the passivation layer was about 20 atomic percent and that the oxygen content of the passivation layer was less than five atomic percent. In fact, no oxygen was detected using an RBS method having a five percent resolution. It is believed that the low hydrogen content is a direct result of the higher silicon content while the low oxygen content is due, in large part, to the cleanliness of the passivation layer production process.

A passivation layer produced using the above-identified process may be dry-etched to remove portions of that layer above the source, drain, and gate electrodes of the devices on which it is applied using a standard etching process, such as one normally used with silicon-poor passivation layers. In particular, a standard etch using $CF_4$ and $O_2$ gases at a power level of 30 watts and a pressure of 40 mTorr was used on a GaAs device to etch the passivation layer produced according to the present invention.

The chart of FIG. 2A illustrates the reverse gate-to-drain breakdown voltage distribution (defined at 1 mA/mm) of the pHEMTs on a wafer before the above-identified PECVD nitride deposition process was implemented. The chart of FIG. 2B illustrates the reverse gate-to-drain breakdown voltage distribution of the pHEMTs on the same wafer after the above-identified nitride deposition passivation process was implemented. As will be noted from FIG. 2A, the median reverse gate-to-drain breakdown voltage (illustrated by the line 40) of the pHEMTs on the wafer before the passivation process was about 27.3 volts. For the sake of illustration, the quartile of the reverse breakdown voltages immediately above the median is represented by the line 42, while the quartile of the reverse breakdown voltages immediately below the median is represented by the line 44. Importantly, as can be seen in FIG. 2B, the median reverse gate-to-drain breakdown voltage (illustrated by the line 50) of the pHEMTs on the wafer after the above-described passivation process was about 27.6 volts, which is an increase of 0.3 volts over the case in which no passivation process was applied.

For comparison, the chart of FIG. 3A illustrates the reverse gate-to-drain breakdown voltage distribution (defined at 1 mA/mm) of pHEMTs on a control wafer before any passivation process was applied while the chart of FIG. 3B illustrates the reverse gate-to-drain breakdown voltage distribution of the pHEMTs on the same control wafer after a standard silicon nitride deposition passivation process was applied thereto. This standard passivation process used a PECVD nitride deposition technique using 52 scams of 5% ammonia in nitrogen, 4.6 scams of silane and 100 scams of nitrogen at a pressure of 800 mTorr and a power of 22 watts to produce a silicon nitride film that was under tensile stress, that had an index of refraction of about 2.0 and that had a nitrogen/silicon ratio of about 1.18 (silicon-poor), as measured by an RBS technique.

As will be noted from FIG. 3A, the median reverse gate-to-drain breakdown voltage (illustrated by the line 60) of the pHEMTs on the control wafer before the prior art passivation process was about 25.9 volts while, as evident from FIG. 3B, the median reverse gate-to-drain breakdown voltage (illustrated by the line 70) of the pHEMTs on the control wafer after the prior art passivation process was about 23.2 volts; a decrease of 2.7 volts over the case in which no passivation layer existed.

Thus, as will be evident from FIGS. 2 and 3, the passivation process of the present invention resulted in an increase in the median reverse gate-to-drain breakdown voltage of 0.3 volts as opposed to the 2.7 volt decrease in the median reverse gate-to-drain breakdown voltage caused by a standard passivation process.

Figure 4:
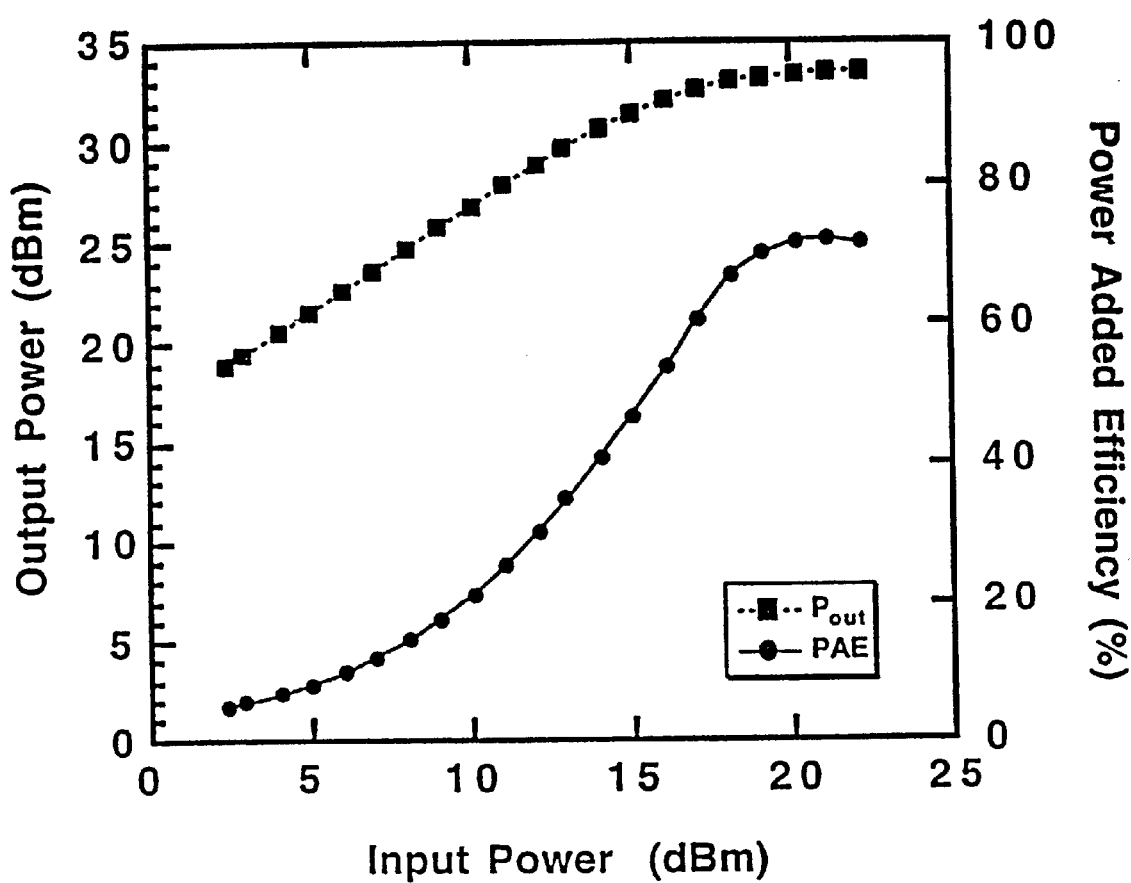
FIG. 4 is a graph illustrating the output power and power-added efficiency as a function of the input power of an amplifier using a pHEMT having a passivation layer according to the present invention.

FIG. 4 includes a chart illustrating the output power and power-added efficiency (defined as the difference between the RF output power and the RF input power divided by the DC power) verses the input power of an amplifier using a 5.6 mm wide pHEMT with a compressive silicon nitride passivation layer ($V_{ds}$ of 7.0 V and $I_{ds}$ of 400 mA/mm) deposited according to the above-described PECVD process. As will be evident to those skilled in the art, the power-added efficiency of such an amplifier is comparable, if not better, than that obtained by an amplifier using a pHEMT having no passivation layer applied thereto.

While a passivation process producing a silicon-rich, compressively stressed nitride passivation layer has been specifically described herein as being used on GaAs pHEMTs, it should be noted that such a process and layer can also be used with or on other types of semiconductor devices, specifically including other Group III-V semiconductor device, such as GaN semiconductor devices, etc. In such cases, the pHEMT 10 of FIG. 1 could be replaced with the desired device and the passivation layer 11 applied to a surface thereof. Furthermore, while a silicon-rich, compressively stressed and high index of refraction passivation layer is described herein as being produced using a PECVD process, such a layer produced by other processes are considered to fall within the scope of this invention.

Moreover, the present invention has been described with reference to specific examples, which are intended to be illustrative only, and not to be limiting of the invention. It will be apparent to those of ordinary skill in the art that changes, additions, and/or deletions may be made to the disclosed embodiments without departing from the spirit and scope of the invention.

What is claimed is:

1. A semiconductor device comprising:
   a semiconductor material having a surface, wherein the semiconductor material is a GaAs semiconductor material; and
   a compressively stressed silicon nitride passivation layer disposed on the surface of the semiconductor material wherein the passivation layer is silicon-rich with respect to stoichiometric silicon nitride ($Si_3N_4$), has a nitrogen/silicon ratio below approximately 0.9, and has an index of refraction greater than or equal to about 2.2.

2. The semiconductor device of claim 1, wherein the passivation layer has a nitrogen/silicon ratio equal to approximately 0.7.

3. A semiconductor device comprising:
   a semiconductor material having a surface, wherein the semiconductor material is a Group III-V semiconductor material; and
   a silicon nitride passivation layer disposed on the surface of the semiconductor material, wherein the silicon nitride passivation layer is silicon-rich with respect to stoichiometric silicon nitride ($Si_3N_4$), has a nitrogen/silicon ratio less than about 0.9, and has an index of refraction between about 2.2 to 2.5.

4. The semiconductor device of claim 3, wherein the passivation layer has a nitrogen/silicon ratio of about 0.7.

5. The semiconductor device of claim 3, wherein the passivation layer is low in hydrogen content when compared to stoichiometric silicon nitride ($Si_3N_4$).

6. The semiconductor device of claim 5, wherein the passivation layer has a hydrogen content below about twenty atomic percent.

7. The semiconductor device of claim 1, wherein the passivation layer is compressively stressed to about $8 \times 10^9$ dynes/cm$^2$.

8. The semiconductor device of claim 1, wherein the passivation layer is compressively stressed to less than $1 \times 10^{10}$ dynes/cm$^2$.

9. The semiconductor device of claim 1, wherein the passivation layer has a hydrogen content below about twenty atomic percent.

10. The semiconductor device of claim 1, wherein the passivation layer has an oxygen content below about five atomic percent.

* * * * *